United States Patent [19]
Parker

[11] Patent Number: 4,471,898
[45] Date of Patent: Sep. 18, 1984

[54] UNIVERSAL MODULAR POWER AND AIR SUPPLY
[75] Inventor: Oscar E. Parker, Glen Burnie, Md.
[73] Assignee: Pace Incorporated, Laurel, Md.
[21] Appl. No.: 372,678
[22] Filed: Apr. 28, 1982
[51] Int. Cl.³ .............................................. H05K 7/14
[52] U.S. Cl. ...................................... 228/20; 361/394; 361/399; 220/4 R
[58] Field of Search ................. 228/20; 361/399, 395, 361/400, 394; 220/4 R

[56] References Cited
U.S. PATENT DOCUMENTS

| | | | |
|---|---|---|---|
| 3,159,436 | 12/1964 | Davis | 220/4 R X |
| 3,411,594 | 11/1968 | Siegel | 228/20 X |
| 3,523,218 | 8/1970 | Fradley et al. | 361/399 X |
| 4,111,328 | 9/1978 | Eggert et al. | 220/4 R |
| 4,117,967 | 10/1978 | Regelson et al. | 228/20 |
| 4,251,853 | 2/1981 | Sites | 361/395 X |
| 4,270,820 | 6/1981 | McMullan et al. | 361/399 X |

Primary Examiner—Kenneth J. Ramsey
Attorney, Agent, or Firm—Gerald J. Ferguson, Jr.; Joseph J. Baker

[57] ABSTRACT

Disclosed is a modular power supply having a case made up of top, bottom and side plates. Each plate has either a male or female portion at the edge which is slidably interconnectable with the edge of an adjacent plate. In addition, male and/or female portions located on the top, bottom and side plates matingly engage with similar female and/or male portions on a handle, output device receptacle, etc. The internal portions of the power supply are divided into three modular components. The first modular component includes a transformer and a primary coil select switch and is connected to the rear portion of the case preventing the case sides from slipping apart from the top and bottom plates. A second modular component is a printed circuit board interconnectable with the first modular component and containing a temperature control circuit and an air pump and motor combination. The second modular component is slidably received into the case. The third modular component comprises a front panel, including controls for the temperature control circuit and sockets for connecting an output utilization device to the present invention. Additionally, an air switch is provided on the front panel which will selectively apply either a vacuum or a variable pressure source to the output utilization device. When the first component is connected to the case, it also prevents separation of the plates making up the case and also retains the printed circuit board in its position in the case.

8 Claims, 3 Drawing Figures

UNIVERSAL MODULAR POWER AND AIR SUPPLY

BACKGROUND OF THE INVENTION

The present invention relates generally to power supply systems and specifically to a power supply which is modularly constructed and which provides not only the required voltage levels from differing supply lines, but also provides an air pressure and vacuum source as needed.

The extensive use of printed circuit boards with various integrated circuit chips mounted thereon in today's electronics industry has prompted several devices for soldering and desoldering components. It is, of course, desirable to be able to apply heat rapidly in a localized area in order to melt the solder bond without unduly heating the component which is being disconnected. Small hand-held soldering irons have been known for years and are useful in this process. However, recently, desoldering devices have been developed which not only apply the required amount of heat to a tip but also apply a vacuum or air pressure to a small aperture at the tip to either aspirate molten solder or to blow molten solder away from the joint area. Obviously, such a device not only needs a source of voltage to operate the heater system, but also a source of vacuum and/or air pressure to be applied to the tip.

Because printed circuit boards are now widely used in all electronic equipment, it is oftentimes necessary to provide repair facilities at many locations around the world wherein the line or supply voltage in that country may be substantially different from the voltage prevalent in the United States. Thus, many power supplies for soldering and desoldering devices, while proper to reduce line voltages in the United States to a useful level, will not work or will be dangerously overloaded if used in a foreign country with a dramatically different supply voltage. Additionally, the present power supplies require extensive and expensive modifications to meet the requirements and preferences of the end user, not to mention the electrical code requirements and line voltage requirements of a particular foreign country.

SUMMARY OF THE INVENTION

In view of the above prior art difficulties, it is desirable to provide an improved power supply which is modular in nature permitting ease of construction and assembly and facilitating the inexpensive repair thereof if necessary.

It is a further object of the present invention to provide a power supply having a case which is not only easily assembled, but easily modified to meet any local electric code requirements around the world.

It is an additional object of the present invention to provide a modular power supply in a case which is easily assembled and modified to meet user requirements with the power supply capable of providing a 12 VOC or 24 VAC level output when connected to different line voltages around the world.

It is a further object of the present invention to provide a universal modular power supply for supplying regulated electrical power to a soldering or desoldering device and also capable of providing a source of vacuum and/or air pressure to said desoldering device.

The above and other objects are achieved by providing an input transformer in the power supply with a switch such that the supply line voltage is connectable to one of several different primary windings in the transformer such that the same 12 or 24-volt output is achieved regardless of the line voltage in the country of use. The switch, transformer, connecting plug, etc. are all combined in one modular component. The printed circuit board holding in a preferred embodiment dual heat regulator circuits and a single vacuum/pressure pump and motor and the electronic circuitry therefor comprise a second modular component. The third modular component is the control panel, which includes on-off switches, heat level setting potentiometers, and multi-connector plugs for connecting the power supply to soldering and desoldering devices. These three modular components are assembled in a modular case comprised of plates equipped with male and female edges which are slidably inteconnectable. Additional portions of the plates have male and/or female interconnecting structures permitting the simplified connection of handles, trays for holding the soldering and desoldering devices, and protective coverings over these trays. A separate jack is provided on the transformer to ground workpieces directly to the supply line ground, eliminating the need for grounding the case in some manner.

BRIEF DESCRIPTION OF THE DRAWINGS

A more complete appreciation of the invention, and many of the attendant advantages thereof, will be readily apparent by reference to the accompanying Drawings, wherein.

DETAILED DESCRIPTION OF PREFERRED EMBODIMENTS

Figure 1:
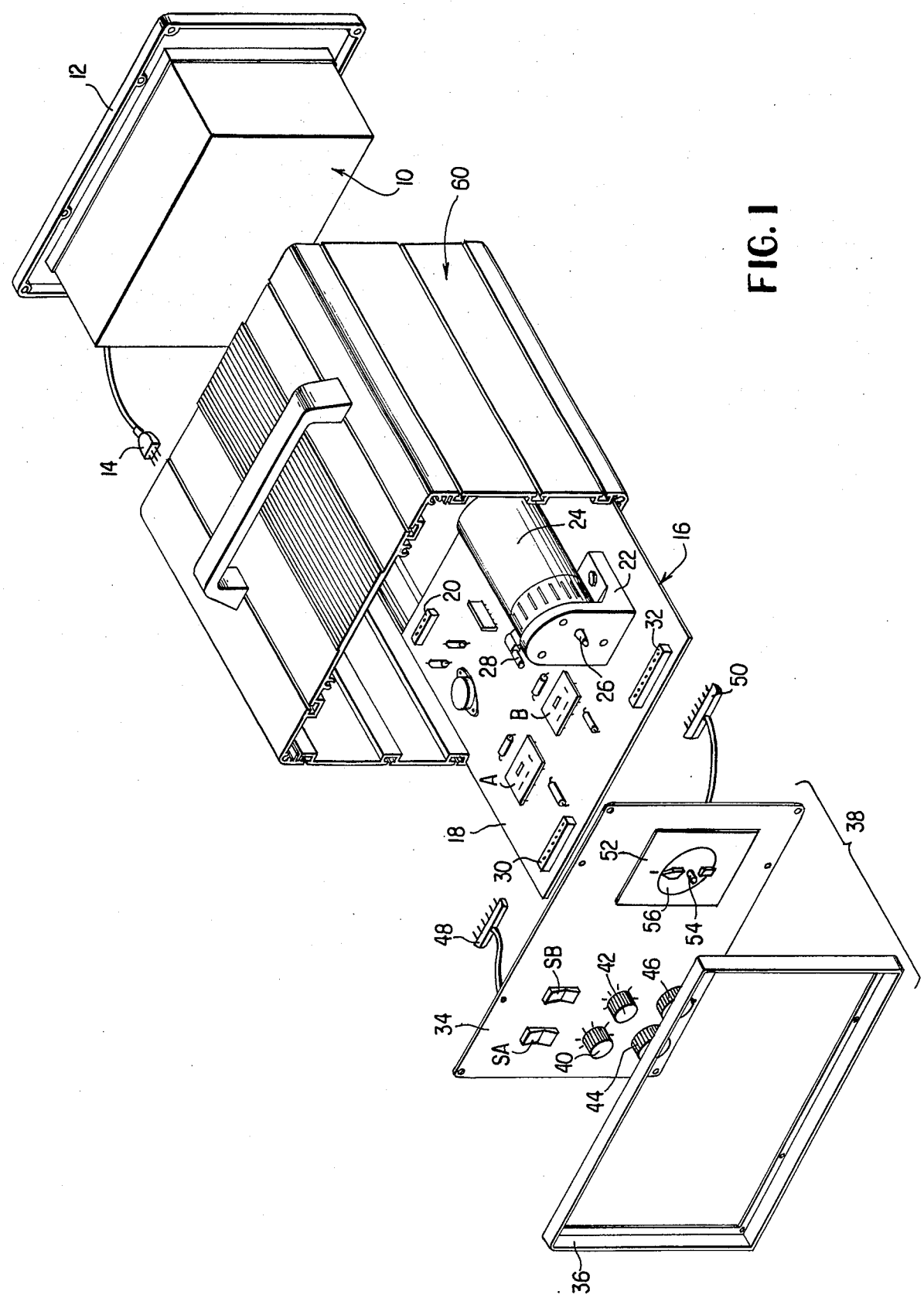
FIG. 1 is a disassembled view of the present invention showing the case and modular components.

Referring now more particularly to the Drawings, wherein like numerals represent like elements throughout the several views, FIG. 1 illustrates the major components of the present invention. The first modular component 10 includes a transformer, rectifier, grounding jack, and a primary coil select switch, al encapsulated in a single unit which is attached to the rear plate 12. The outputs of the first modular component (AC, DC, and common) are supplied by means of three-pronged plug.

The second modular component 16 comprises printed circuit board 18 on which is mounted a socket 20 which is compatible with three-pronged plug 14. Also mounted on the printed circuit board are air pump 22 and air pump drive motor 24. The air pump has a vacuum port 26 and a pressure port 28 which, when the motor is in operation, provide simultaneously a vacuum and pressure source, respectively. The printed circuit board also includes temperature control circuit "A" and temperature control circuit "B" for regulating the temperature of soldering and desoldering devices connected to the power supply. The output and control functions of the temperature control circuits are connected to sockets 30 and 32.

Front panel 34 comprises the third modular commponent 38 shown in a slightly disassembled fashion. In a preferred embodiment, two power dispensing units are provided on the front panel, each of which has separate rocker switches SA, SB, level setting potentiometers 40 and 42, and sockets 44 and 46, which correspond with plugs on the output device whether it be a soldering or desoldering unit. These controls and the sockets in the power dispensing units are connected to the second modular component by means of plugs 48 and 50.

In a preferred embodiment, an air switch 52 directly connects the vacuum and pressure ports of the air pump 22 when assembled. The air switch, in a preferred embodiment, provides either vacuum or pressure to the output device port 54. By turning the air switch control valve 56, the operator can select either vacuum or pressure and in a preferred embodiment, vary the amount of pressure supplied to an output device connected to the output device port 54.

Figure 2:
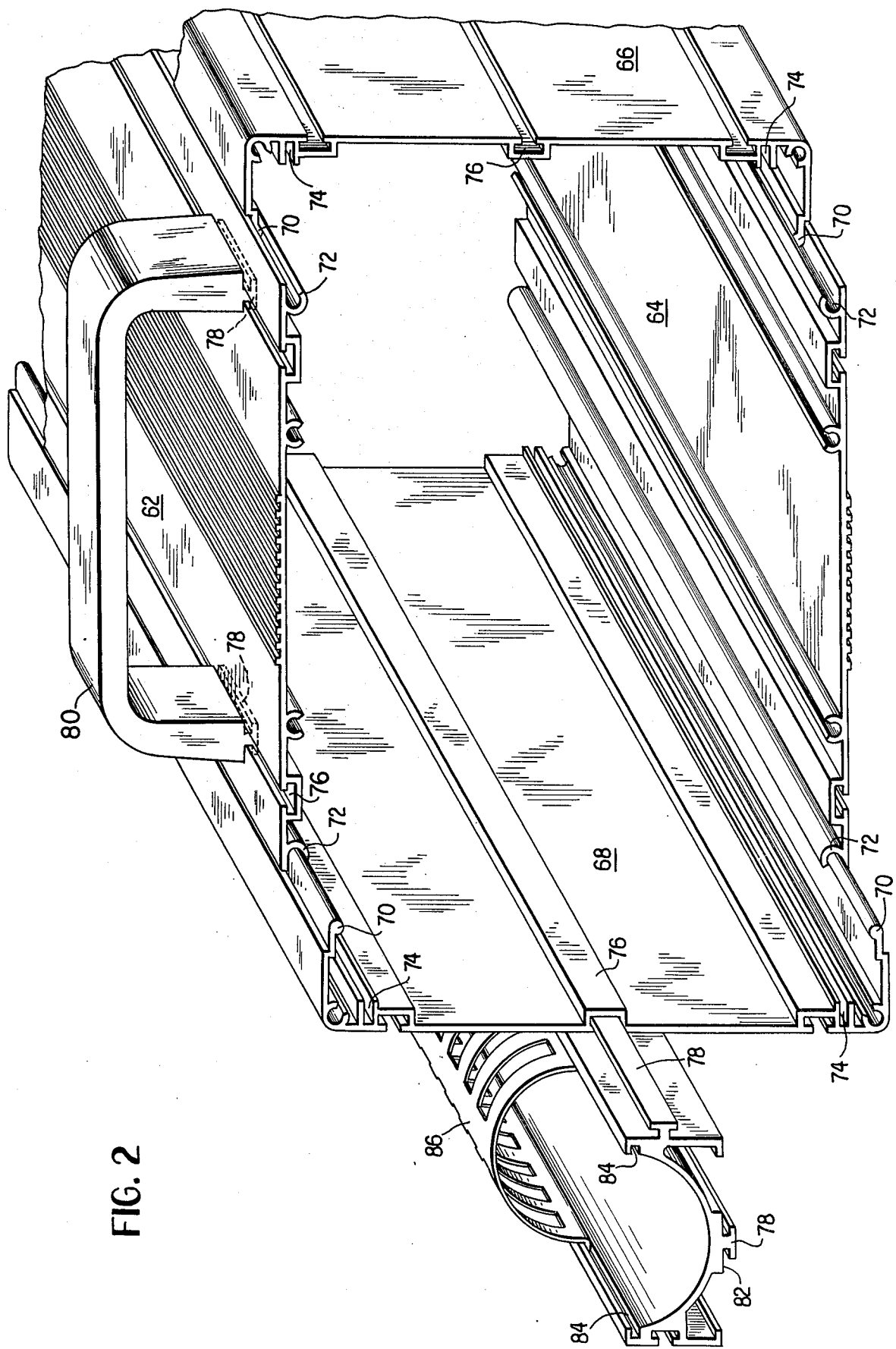
FIG. 2 is an exploded view of a preferred embodiment of the case in the present invention.

The first, second and third modular components are sized to fit inside case 60, the details of which can be more clearly seen in FIG. 2. In a preferred embodiment, the case is made up of top plate 62, bottom plate 64, and side plates 66 and 68. A means for interconnecting the plates is provided in the form of an extruded male interconnecting member 70 (as shown on side plates 66 and 68) and extruded female interconnecting member 72 (as shown on top plate 62 and bottom plate 64). It can be seen that the male member has a portion which is slightly larger than the aperture in the female member such that once they have been slidably mated (in the direction of extrusion) they cannot be separated in any direction other than said extrusion direction. Thus, the top, sides and bottom can be slidably interconnected to form the case 60, as shown in FIG. 1.

It will also be observed that in a further preferred embodiment, side plates 66 and 68 have a second modular component mounting means comprising grooves 74 on the interior portion thereof. As can be seen in FIG. 1, the printed circuit board is retained against movement in any direction other than the extrusion direction when slid into place along these grooves. It can also be seen that once the rear plate of the first modular component is connected to the case from the rear and the trim ring 36 of the third modular component is secured to the front of the case, the second modular component will be prevented from movement in the extrusion direction, as will be the top, bottom and sides of the case.

In a further preferred embodiment, at least the top plate includes a handle interconnecting means in the form of extruded female channel 76 which cooperates with extruded male elements 78 extending from handle 80 allowing the handle to be slid into position on the top plate 62.

In a further preferred embodiment, an output device receptacle 82 has one or more extruded male elements 78 which are slidably engageable with extruded female channels 76 located on the side, top, and/or bottomm plates of the case. Thus, an output device receptacle can be placed at any desired location (in accordance with the customer's preferences) to hold a hot soldering and/or desoldering device when not in use. In a further preferred embodiment, the receptacle has a groove 84 on either side of the upper portion into which a protective cover 86 can be slid serving to protect the operator from inadvertently touching the hot end of the device.

It will be clear to one of ordinary skill in the art that the arrangement of the extruded male and female interconnecting parts can be reversed or placed in any desirable combination. It is only necessary that adjacent edges of the plates have one male and one female portion to permit slidable and mateable interconnection therebetween. Additionally, the organization of female channels and male elements on the handle, the receptacle and the top, bottom and sides of the case can be rearranged or interchanged if desirable. It should be noted that the handle is maintained in position (in the extrusion direction) by inserting spacer elements (not shown) in the female channel 76 on either side of the male element 78 and that these spacer elements will be maintained in position by the mounting of the first and third modular components on the case.

Figure 3:
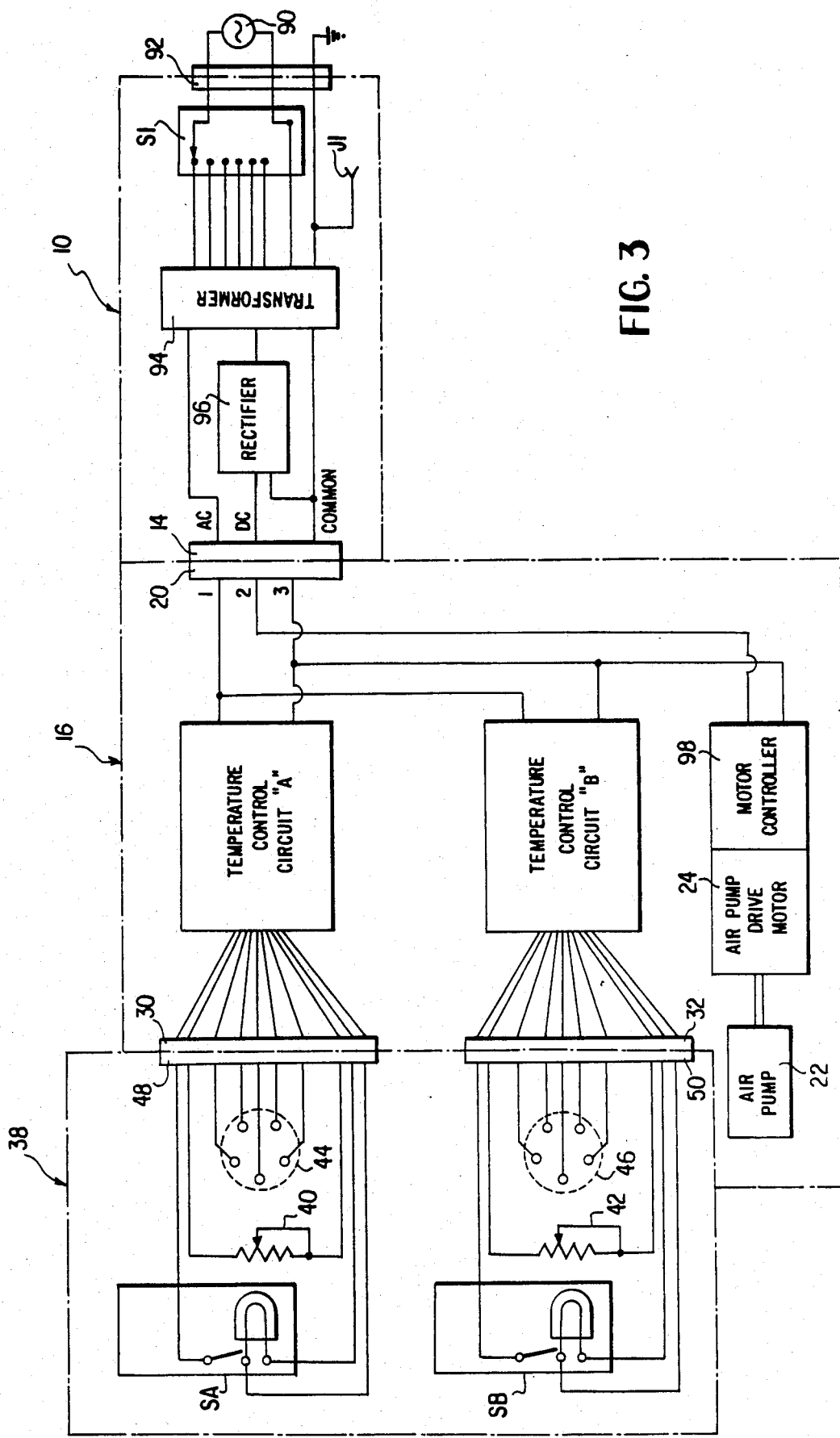
FIG. 3 is a block diagram showing the electrical schematic of the modular components of the present invention.

Details of the electronic structures utilized in applicant's power supply can be seen in FIG. 3. In the first modular component 10, a plug connected to the local supply line voltage 90 is connected to socket 92 and from there connected to multiple position switch S1. This switch connects the supply line voltage to one of six different primary coil configurations in transformer 94. The ground connection is also connected through socket 92 to the transformer ground at external grounding jack J1. Secondary windings in the transformer for the AC output are applied directly to plug 14 as the AC and common inputs to the plug. Another alternating current source for the transformer is supplied to rectifier 96 which, in a preferred embodiment, is a full-wave rectifier. The output of rectifier 96 is either 12 or 24 volts DC between the DC line and the common line. In a preferred embodiment, a filter capacitor and a load resistor are also included in rectifier 96 to smooth the ripple in the DC output.

Power is supplied through socket 20 to temperature control circuits "A" and "B" and thereupon to drive motor 24 and motor controller 98. The control indicator and output connections from temperature control circuits "A" and "B" are provided to sockets 30 and 32, respectively, in one embodiment. It may additionally be advantageous to provide a motor control connection from motor controller 98 to these sockets as well.

In the third modular component 38, plugs 48 and 50 connect with sockets 30 and 32, respectively, and are connected to various control and utilization circuits for the respective power and dispensing units. Switches SA and SB turn on and off their respective temperature control circuits as shown and could also be wired to turn on and off the air pump drive motor 24 through motor controller 98. Preferably, these switches are rocker switches with an internal light which indicates the status of the switch. Potentiometers 40 and 42 set the temperature levels which are subsequently controlled by temperature control circuits "A" and "B". The output utilization devices such as a soldering or desoldering unit is connected through sockets 44 and/or 46 to the temperature control circuits. After the desired temperature has been set with the potentiometers, the temperature control circuits will maintain the heater element in the output device at a relatively steady temperature. The design and implementation of such temperature control circuits are well known to those of ordinary skill in the art of soldering and desoldering devices.

Although the present invention has been described with regard to one embodiment, in view of this disclosure, it will be obvious that many modifications of such a device would be obvious to those of ordinary skill in the art. For example, only one or multiple temperature circuits could be utilized, depending upon how many soldering and/or desoldering devices were necessary for a particular job. The modular aspect permits a certain amount of interchangeability between components. For example, if only a single output device were to be powered by the power supply, the third modular component would contain only the single rocker switch, potentiometer and socket. Obviously, the second modular component would contain only a single temperature control circuit, although a second modular component containing two temperature control circuits could be substituted if necessary. Additionally, the first modular component would probably remain the same for either configuration. Similarly, if a problem is encountered in terms of the failure of one modular component, the entire component can be replaced, allowing the user to maintain a very low "down" time operation. Each of these units can be designed to meet the electric codes of all major countries or, in the alternative, a modular component designed to meet a particular country's electric code could easily be substituted, providing an extremely quick turn-around time to prepare the power supply for operation in a different foreign environment. As previously noted, the air switch supplies selectively a vacuum or air under pressure to the output device port 54. It has been found advantageous to provide a small air filter between air switch 52 and the vacuum port 26 of air pump 22 in order to protect the pump against the ingestion of dirt and other contaminating objects.

Therefore, in view of the above disclosure, the specific plugs, switches, transformer, rectifier, motor controller, air pump drive motor and air pump, temperature control circuits, etc. will be obvious to one of ordinary skill in the art based upon the particular requirements of the group of countries in which he is interested. Because many modifications of the above-disclosed device will be obvious to those of ordinary skill in the art in view of this disclosure, the invention is not limited to the specific embodiments disclosed in this specification. The present invention, therefore, is limited only in accordance with the appended claims.

The embodiments of the invention in which an exclusive property or privilege is claimed are defined as follows:

1. A universal modular power and air supply having an easily assembled and modified case, said case having a top, a bottom, and two sides, said case comprising:
   a plurality of extruded plates, said plates forming the top, bottom and sides of said case, each of said plates including means for slidably interconnecting one plate with an adjacent plate,
   said slidably interconnecting means on said one plate comprising one of an extruded male interconnecting member and an extruded female interconnecting member and said slidably interconnecting means on said adjacent plate comprising the other of said extruded male interconnecting member and said extruded female interconnecting member, and
   said power supply including a handle, at least one of said plates includes a handle interconnecting means, said handle interconnecting means comprising one of an extruded female interconnecting member and an extruded male interconnecting member and said handle including the other of said extruded female interconnecting member and said extruded male interconnecting member, said handle interconnecting means and said handle comprising means capable of mating engagement.

2. A universal modular power and air supply having an easily assembled and modified case, said case having a top, a bottom, and two sides, said case comprising:
   a plurality of extruded plates, said plates forming the top, bottom and sides of said case, each of said plates including means for slidable interconnecting one plate with an adjacent plate,
   said slidably interconnecting means on said one plate comprising one of an extruded male interconnecting member and an extruded female interconnecting member and said slidably interconnecting means on said adjacent plate comprising the other of said extruded male interconnecting member and said extruded female interconnecting member, and
   said case further including a receptacle means for holding an output device, said receptacle means having one of an extruded female interconnecting member and an extruded male interconnecting member and one of said plates including a receptacle interconnecting means comprised of the other of said extruded female interconnecting member and said extruded male interconnecting member, said receptacle interconnecting means and said receptacle comprising means capable of mating engagement.

3. The power and air supply according to claims 1 or 2, wherein said case comprises a single top plate, a single bottom plate, and two side plates, said top plate interconnecting means and said bottom plate interconnecting means comprises said extruded female interconnecting member and said side plate interconnecting means comprises said extruded male interconnecting member.

4. A universal modular power and air supply as in claims 1 or 2 including three modular components carried by said case, said components comprising:
   a first modular component comprising a transformer means, connectable with a plurality of different Alternating Current supply voltages, for reducing said supply voltage to a safe working voltage and for providing a Direct Current motor voltage, said first modular component further comprising a switch means for interconnecting different primary windings in said transformer to said Alternating Current supply voltages;
   a second modular component comprising a printed circuit board, an air pump, an air pump motor, and means for electrically connecting said circuit board and said air pump motor to said transformer means, said printed circuit means including at least one temperature control means; and
   a third modular component, connected to said second modular component, comprising at least one power dispensing unit, said unit comprising socket means connectable with an output device, switch means connected to said second modular component for controlling power applied to said temperature control means, and adjustment means for adjusting the output of said temperature control means, said socket connecting said temperature control means to said output device.

5. The power and air supply according to claim 4, wherein said case includes at least two sides, each side having an internal and an external surface, each internal surface including means defining a groove therein such that edges of said printed circuit board and said groove defining means comprise means for mounting said printed circuit board in said case.

6. The power and air supply according to claim 5, wherein said air pump has pressure and vacuum ports and said air pump motor is connected to said Direct Current motor voltage of said transformer means and said third modular component including air switch means, connected to both of said air pump ports, for selectively applying one of said pressure port and said vacuum port to an output device port.

7. The power and air supply according to claim 6, wherein said case has a top, a bottom, and two sides, said case comprising a plurality of extruded plates, said plates forming the top, bottom, and sides of said case, each of said plates including means for slidably interconnecting one plate with an adjacent plate.

8. The power and air supply according to claim 1, wherein said case further includes a receptacle means for holding an output device, said receptacle means having one of an extruded female interconnecting member and an extruded male interconnecting member and one of said plates includes a receptacle interconnecting means comprised of the other of said extruded female interconnecting member and said extruded male interconnecting member, said receptacle interconnecting means and said receptacle comprising means capable of mating engagement.

* * * * *